United States Patent
Damon et al.

[11] Patent Number: 6,070,131
[45] Date of Patent: May 30, 2000

[54] SYSTEM FOR EVALUATING AND REPORTING SEMICONDUCTOR TEST PROCESSES

[75] Inventors: Tim Damon, Meridian; Blane Holden; Matt Adsitt, both of Boise; Dan Dean, Meridian; Mike Pearson, Boise, all of Id.

[73] Assignee: Micron Technology, Inc., Boise, Id.

[21] Appl. No.: 08/937,626

[22] Filed: Sep. 26, 1997

[51] Int. Cl.⁷ .................................................. G05B 15/00
[52] U.S. Cl. .......................................... 702/122; 702/182
[58] Field of Search ............................. 702/84, 182, 183, 702/184, 185, 81; 364/468.16, 468.17

[56] References Cited

U.S. PATENT DOCUMENTS 5,440,478   8/1995   Fisher et al. ............................. 364/188
5,661,669   8/1997   Mozumder et al. ..................... 364/552

OTHER PUBLICATIONS

Judith Gersting, Mathematical Structures for Computer Science, Computer Science Press, p. 156, no known month 1993.

*Primary Examiner*—Timothy P. Callahan
*Assistant Examiner*—Linh Nguyen
*Attorney, Agent, or Firm*—Schwegman, Lundberg, Woessner & Kluth, P.A.

[57] ABSTRACT

A system is disclosed for evaluating relevant data across independent test sequences and providing a consumable output to give a tester an accurate account of the test data. A method for reporting the results of the test processes includes several steps. First, repair, trending, characterization, timing and engineering data for two separate test sequences are read. Next, the data is compared. Also, an analytical report of the test data comparisons is assembled and output.

18 Claims, 8 Drawing Sheets

ENGINEERING REGISTER SUMMARY:

| REGISTER | BASE | CORR | DELTA |
|---|---|---|---|
| ENG_REGISTER_001 | 51.33 | 52.00 | 0.67 |
| ENG_REGISTER_002 | 493.33 | 514.33 | 21.00 |
| ENG_REGISTER_003 | X | X | NA |
| ENG_REGISTER_004 | X | X | NA |
| ENG_REGISTER_012 | -64.00 | -63.00 | 1.00 |
| ENG_REGISTER_033 | -121.33 | -123.33 | -2.00 |
| ENG_REGISTER_034 | 5569.67 | 5569.67 | 0.00 |
| ENG_REGISTER_045 | X | X | NA |
| ENG_REGISTER_047 | X | X | NA |
| ENG_REGISTER_048 | 31.33 | 31.33 | 0.00 |
| ENG_REGISTER_049 | X | X | NA |
| ENG_REGISTER_056 | 43.00 | 42.67 | -0.33 |
| ENG_REGISTER_100 | 58.67 | 58.67 | 0.00 |
| ENG_REGISTER_117 | 69.67 | 69.67 | 0.00 |
| ENG_REGISTER_118 | 44.33 | 44.33 | 0.00 |
| ENG_REGISTER_119 | 2.22 | 2.22 | 0.00 |
| ENG_REGISTER_125 | 3.84 | 3.85 | 0.00 |

FIG. 4

TRENDING REGISTER SUMMARY:

| REGISTER | BASE | CORR | DELTA |
|---|---|---|---|
| TRENDING_GRP_01 | 1045.555 | 940.956 | -104.598 |
| TRENDING_GRP_02 | 57.602 | 58.096 | 0.494 |
| TRENDING_GRP_03 | X | X | NA |
| TRENDING_GRP_04 | -0.089 | -0.030 | 0.059 |
| TRENDING_GRP_05 | 3.805 | 3.803 | -0.002 |
| TRENDING_GRP_06 | 6.503 | 8.892 | 2.389 |
| TRENDING_GRP_07 | X | X | NA |
| TRENDING_GRP_08 | 0.000 | 0.000 | 0.000 |
| TRENDING_GRP_09 | 0.000 | 0.000 | 0.000 |
| TRENDING_GRP_10 | X | X | NA |

FIG. 5

REPAIR SUMMARY: WAFER#1 AT BASE STEP
VS. WAFER#2 AT CORRELATE STEP

60

| TOTALS | BASE | CORR | DELTA |
|---|---|---|---|
| REPAIR STATISTIC 1 | 611 | 597 | -14 |
| REPAIR STATISTIC 2 | 49 | 38 | -- |
| REPAIR STATISTIC 3 | 139 | 140 | 1 |
| REPAIR STATISTIC 4 | 884 | 872 | -12 |
| REPAIR STATISTIC 5 | 1023 | 1012 | -11 |
| REPAIR STATISTIC 6 | 1.67 | 1.70 | 0.021 |

TOTAL MATCHING REPAIRS = 974
TOTAL NON-MATCHING REPAIRS = 87
TOTAL UNIQUE REPAIRS = 1061

RATIO OF # MATCHES TO # REPAIRS FOR WAFER#1 AT BASIC STEP     = 974 / 1023 = 95.21%
RATIO OF # MATCHES TO # REPAIRS FOR WAFER#2 AT CORRELATE STEP = 974 / 1012 = 96.25%
RATIO OF # MATCHES TO # UNIQUE REPAIRS                        = 974 / 1061 = 91.80%

| | 1 | 2 | 3 | 4 | 5 | 6 | 7 | 8 | U | TOTAL |
|---|---|---|---|---|---|---|---|---|---|---|
| 1 | 578 | 0 | 8 | 0 | 0 | 0 | 0 | 0 | 1 | 587 |
| 2 | 1 | 240 | 0 | 0 | 0 | 0 | 1 | 0 | 35 | 277 |
| 3 | 0 | 0 | 68 | 0 | 0 | 1 | 3 | 0 | 4 | 76 |
| 4 | 0 | 0 | 1 | 7 | 0 | 0 | 0 | 0 | 0 | 8 |
| 5 | 1 | 0 | 0 | 0 | 28 | 0 | 0 | 0 | 6 | 35 |
| 6 | 0 | 0 | 0 | 0 | 0 | 18 | 0 | 0 | 1 | 19 |
| 7 | 0 | 0 | 0 | 0 | 0 | 0 | 19 | 0 | 2 | 21 |
| 8 | 0 | 0 | 0 | 0 | 0 | 0 | 0 | 0 | 0 | 0 |
| U | 16 | 6 | 7 | 0 | 7 | 1 | 1 | 0 | 0 | 38 |
| TOTAL | 596 | 246 | 84 | 7 | 35 | 20 | 24 | 0 | 49 | 1061 |

HORIZONTAL AXIS = WAFER #2 AT CORRELATE STEP
VERTICAL AXIS = WAFER #1 AT BASE STEP
U = UNMATCHED REPAIRS

SYSTEM FOR EVALUATING AND REPORTING SEMICONDUCTOR TEST PROCESSES

BACKGROUND

The present invention relates to systems for testing a manufacturing of an article, or the like, such as a memory device. In particular, the present invention relates to a system for evaluating and comparing data from two manufacturing tests performed during the manufacture of memory devices and then providing a consumable output to identify the relation between the data from the manufacturing tests.

Exercising a semiconductor-type memory device during manufacturing for testing purposes is known. Such exercising can include running all ones or zeros through the device and then recording the output, or running checkerboard patterns, digit stripes, double digit stripes, or other pattern mechanisms or ways of writing to a device, and comparing the actual output to an expected output for a given set of conditions such as supply and substrate voltage, or conditions with regard to timing, etc.

The results of such exercises are evaluated to provide information on the device and the testing process. Outputs of such tests are collected and a determination made as to whether the device had passed or failed. Data accumulated from the tests is logged, but each engineer or tester who wants to look at the data in order to make comparisons must go through the data by hand. If a change is to be made to the testing process, testers run a second sequence of tests on the device previously tested. Such test sequences could be used for, for example, to catch a new error mechanism or to eliminate a redundant test. To date, this evaluation has been done by hand.

Calculating repair solutions as a function of the testing process is also known. In the case of repair solutions, performed on a per die basis, this system was only feasible as long as the number of dice remained relatively small. As die sizes decreased, and as wafer sizes increased, thus increasing the number of dice, the number of repair solutions, increased geometrically. Consequently, the manual evaluation of data became overly burdensome. Even when the evaluation of test results became automated, the sheer amount of data that a test could provide prevented a thorough evaluation of all of the test results. For example, some manufacturers opted to analyze the data only after the tests were performed, and then only consider summaries of test data.

What is needed is a mechanism to evaluate all relevant data across independent test procedures and to provide a consumable output to give the tester an accurate account of the test results. In addition, what is needed is a way of present repair solutions which allow a facile comparison of different approach to generating the solutions.

SUMMARY OF THE INVENTION

The present invention is directed to a system for evaluating relevant data across independent test sequences and providing a consumable output to give a tester an accurate account of the test data. A method for reporting the results of the test processes includes several steps. First, repair, trending, characterization, timing and engineering data for two separate test sequences are read. Next, the data is compared. Also, an analytical report of the test data comparisons is assembled and output.

DETAILED DESCRIPTION OF THE PREFERRED EMBODIMENTS

Figure 1:
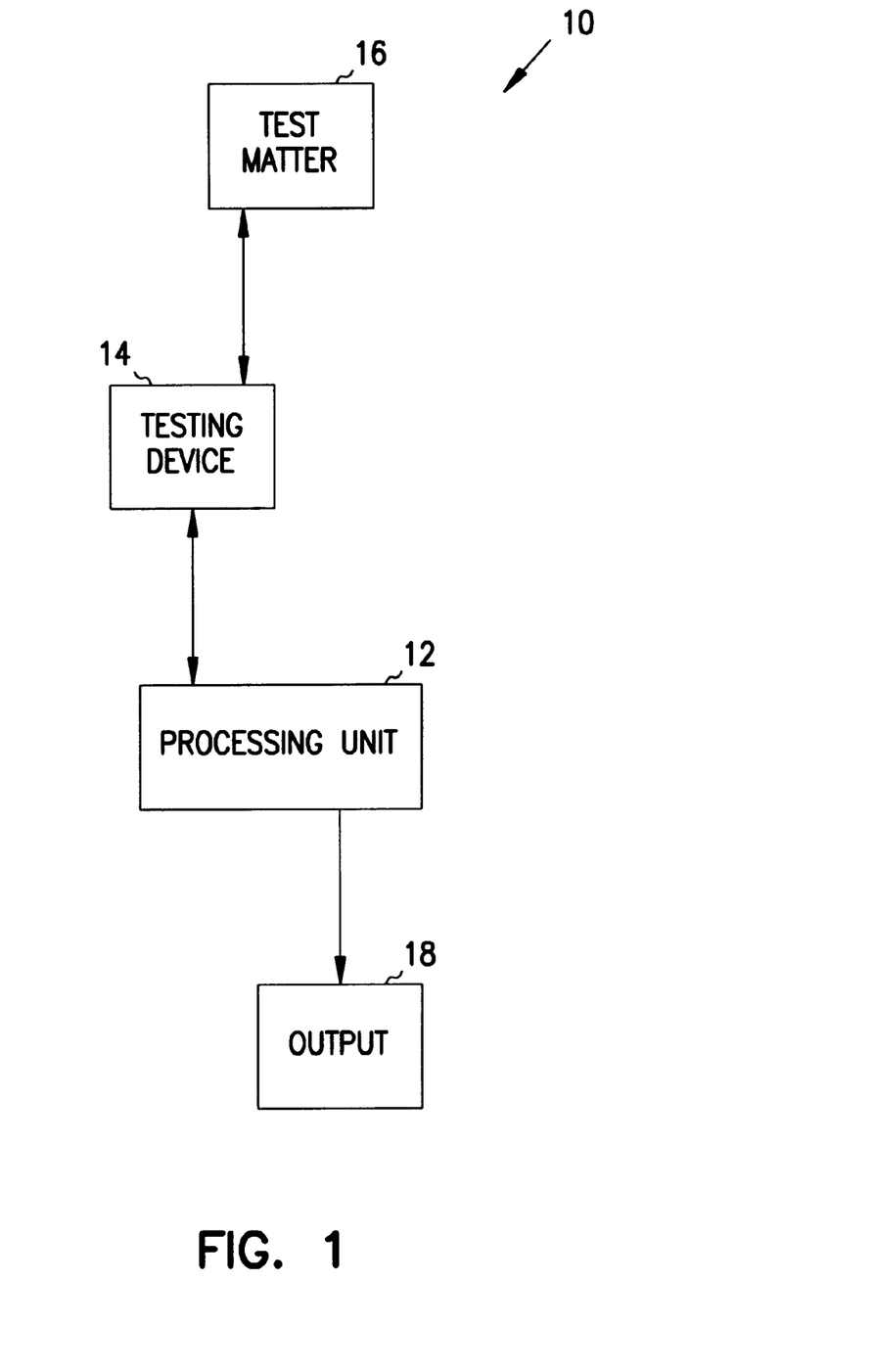
FIG. 1 shows a functional block diagram of a system constructed in accordance with the present invention.

FIG. 1 shows a functional block diagram of a system 10 constructed in accordance with the present invention. System 10 includes a processing unit 12, such as a computer, operably coupled to a testing device 14, such as a memory tester, voltmeter, or the like. The testing device 14 is suitable for operating on a test subject matter 16 which may include a memory device, wafer, or die. The processing unit 12 is connected to an output mechanism 18 such as a printer, display, or the like. In operation, the testing device 14 accesses the test subject matter 16 in a predetermined manner and provides an input to the processing unit 12. The processing unit 12 processes the data received from two separate tests on the subject matter 16 and then, through the output mechanism 18, provides a consumable output to allow the tester to identify relationship between data sets.

Figure 2:
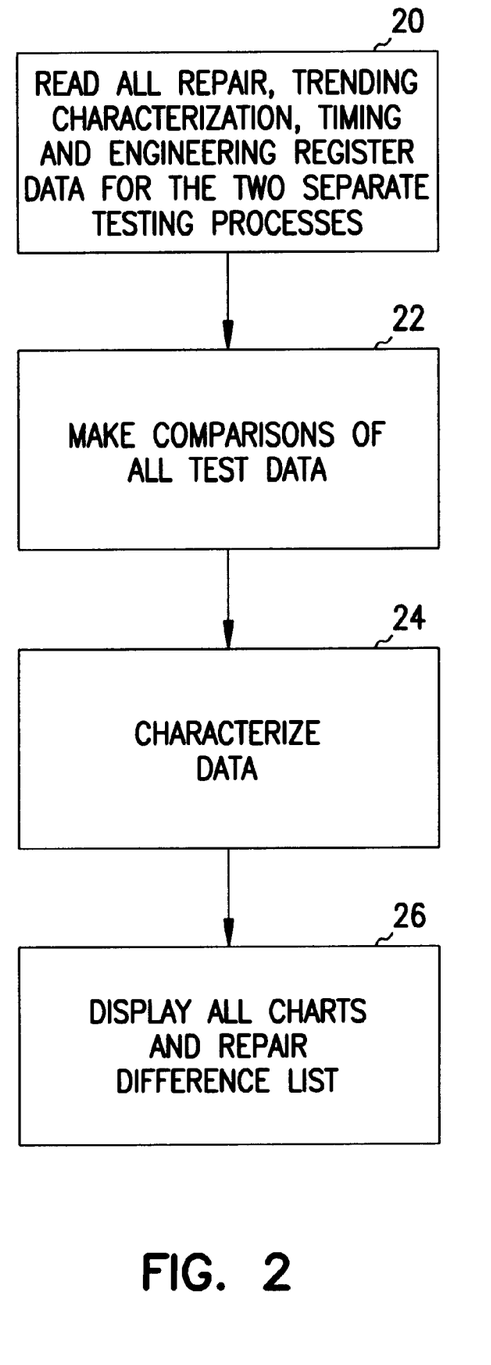
FIG. 2 shows a process flow chart embodying features of the present invention.

FIG. 2 shows a process flow chart embodying features of the present invention. Specifically, FIG. 2 shows a general overview of the method of comparing the test data and providing a consumable output. To begin, at 20 all repair, trending, characterization, timing and engineering data are read for two separate testing processes of the subject matter. For example, datum specific to an individual die is related to that die using the lot, wafer, x-y die coordinates, and wafer size. Other data, such as probe time, are related only to the wafer.

The next step is, at 22, to make comparisons of all the test data 22. The comparison is subject to the specific data being compared. For example, a wafer probe time comparison would simply be a subtraction of the times. In the case of a repair solution, the comparison is done by matching the address of each solution with the other solutions to try to find a match. The number of matches and non matches are counted for use in calculating a correlation score. After the comparisons are complete, the next step is, at 24, to present characterize the data compared at 22 in charts and forms. The last step of the illustrated process includes displaying, at 26, the result of this characterization.

Figure 3:
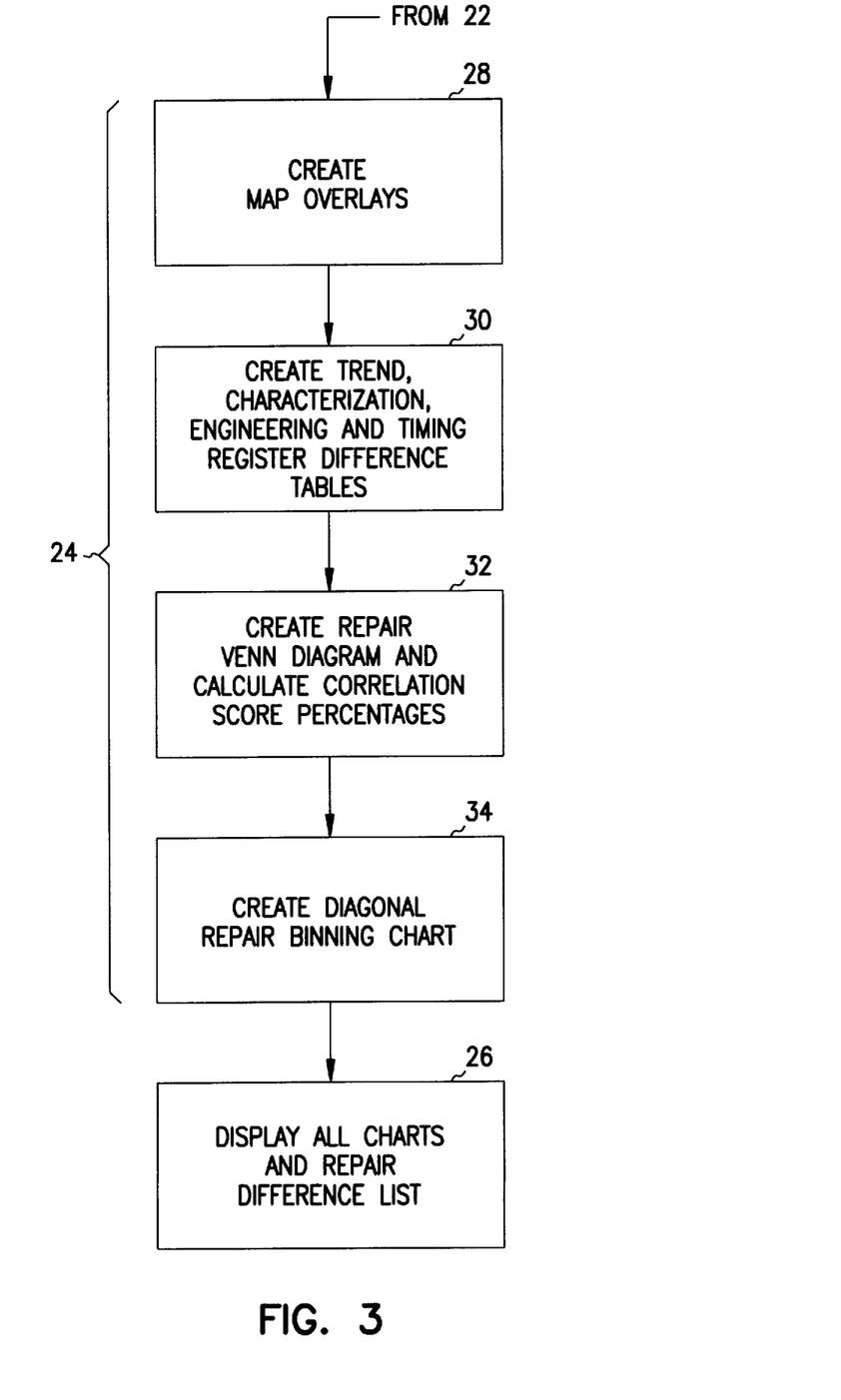
FIG. 3 shows a detail of a feature of the flow chart of FIG. 2.

FIG. 3 shows one embodiment of a characterization which can be used in step 24 of FIG. 2. Step 24 can include creating map overlays of the test data 28, creating trend, characterization, engineering and timing difference tables 30, creating a repair Venn diagram and calculating a correlation score percentage 32, and creating a diagonal repair binning chart 34.

In the case of repair solutions, for example, the comparison output is provided in three different formats to provide more extensive information about the correlation. First, a Venn diagram showing the set relationship between the two sets of solutions is presented, along with three scores for determining the successfulness of correlation. Calculation of the three scores is described in the context of FIG. 7 below. Second, a chart is provided to show how many repairs are made for each test within each testing process in order to help determine the failure relationship between tests. For example, if a test were to be removed, it would be possible to view a location of the repair solution, i.e. if there were 20 repair solutions at a given test during a first testing process and the given test was removed for a second testing process, 10 solutions may be indicated on the different test and the remaining 10 solutions might not be indicated at all. Finally, a list of all repair solution differences can be reported for each die. Other comparison information can be presented in the form of a map overlay produced through a program such as the VAX-based program "LMR".

FIGS. 4–8 show comparison outputs in accordance with the present invention for a particular example set forth below. By way of background for the present example, final die testing reports that there is a 1% failure due to a test on a particular group of wafers. During probing of a wafer, a first test sequence labeled BASE STEP, is run with standard procedures and error data with respect to the wafer and its elements are recorded. After completion of the BASE STEP test sequence, the timing or voltage Vcc is adjusted in order to provide a more stringent test of the wafer. A second test sequence, labeled COMPARISON STEP or CORRELATION STEP, is run on the same subject matter and a second set of error data is recorded and calculated. Subsequently, the error solutions are compared, and matches and correlations between the first test and second test are identified as a usable output.

Figure 4:
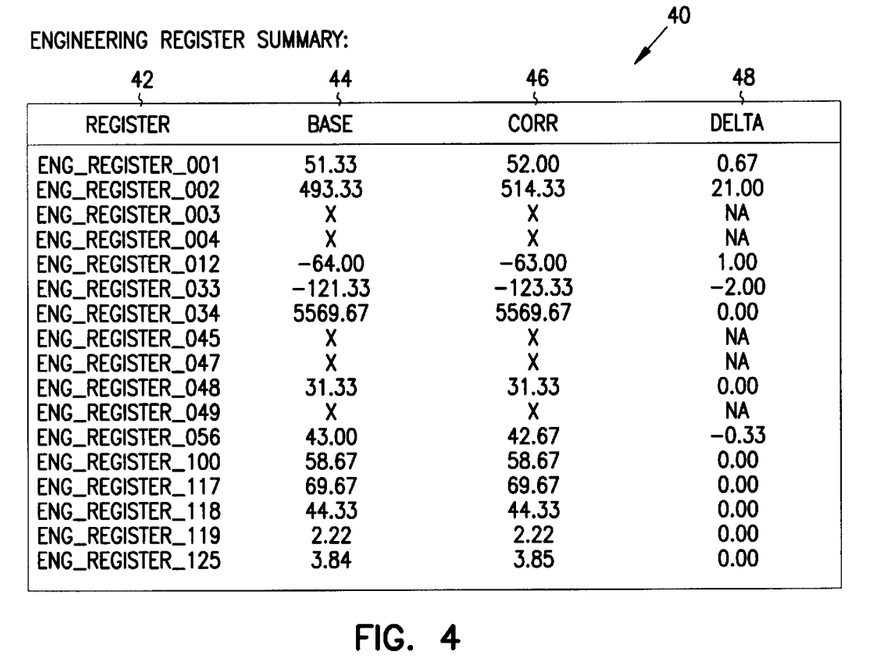
FIG. 4 shows an example of an output in accordance with the process flow chart of FIG. 9.

FIG. 4 shows an example of a characterization table labeled as an engineering register summary 40. The values listed in the table represent values that are averages taken on samples of die across a wafer, e.g. five die per wafer, from data stored as part of each run of the test. A plurality of registers are listed in the first column 42. Such tests are now known in the art involve measuring different timings and voltages, etc. The second column contains values obtained from a first test, i.e. the BASE test 44. The third column contains values obtained from a second test, i.e. the COMPARISON test 16. The fourth column, or delta column, represents the differences between these two tests within the register 48.

Figure 5:
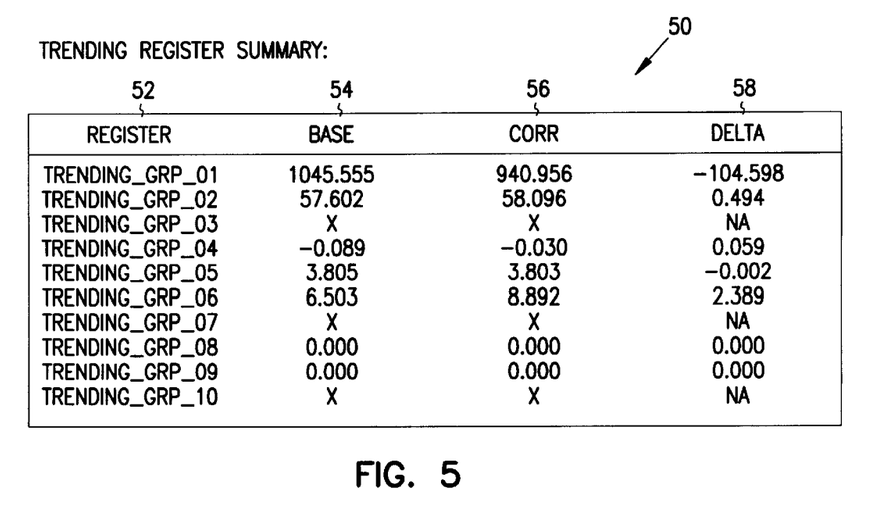
FIG. 5 shows an example of an output in accordance with the process flow chart of FIG. 9.

FIG. 5 shows an example of a trending table which represent an average of all die 50, as opposed to just samples of die as taken above. The first column again represents a plurality of registers 52. The second column represents the values obtained from the first test sequence 54. The third column represents values obtained from the second test sequence 56. The last column represents the difference between the two values in a given register, or the delta 58.

Figure 6:
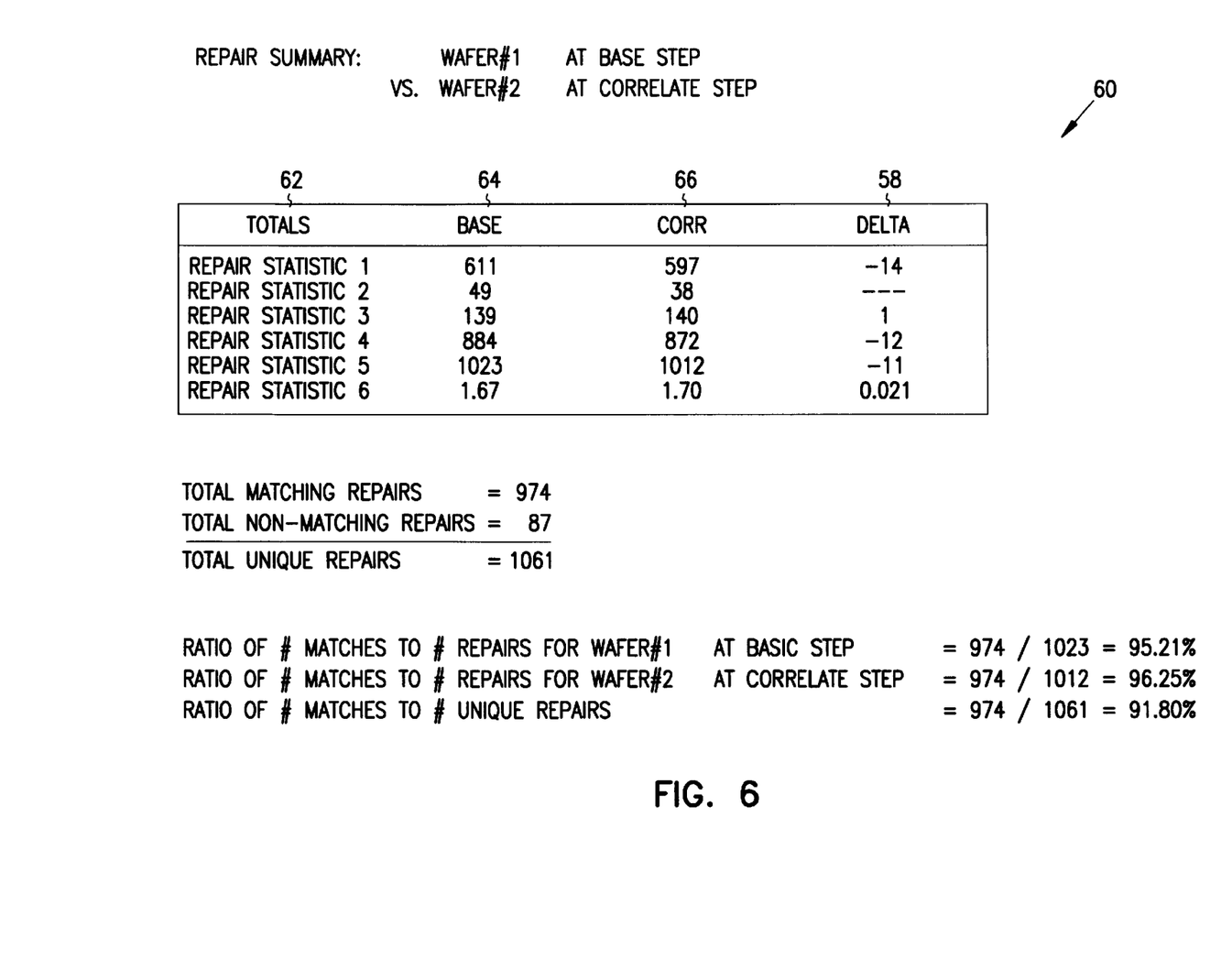
FIG. 6 shows an example of an output in accordance with the process flow chart of FIG. 9.

FIG. 6 shows an example of a repair summary 60. The wafer-total statistics are output on the repair summary. The totals column 62 represents a particular set of data. The values for a given set are again set out in columns according to the first test 64, the second test 66 and the delta 68.

Figure 7:
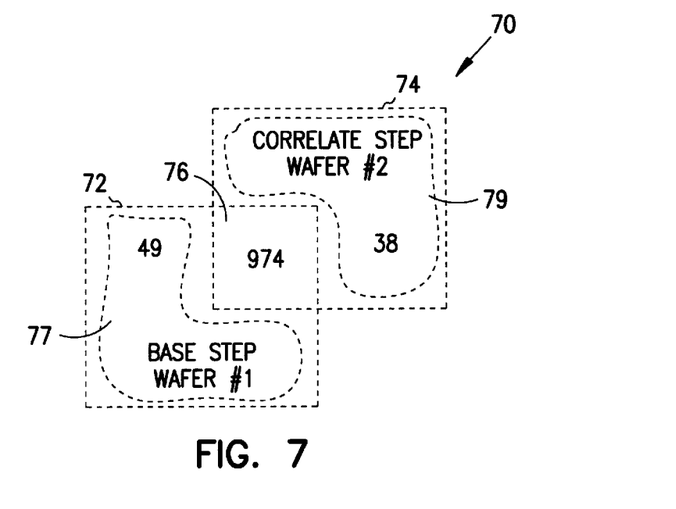
FIG. 7 shows an example of an output in accordance with the process flow chart of FIG. 9.

FIG. 7 shows an example of a Venn Diagram of repair solution statistics 70. The sets represent data collected in a particular test. In the present example a first set 72 corresponds with the first test sequence, and a second set 74 corresponds with the second test sequence. Common solutions are indicated in the intersection of the sets 76. The first test, or base step, unique solutions are indicated at 77. A unique solution is one that was proposed in one test but not in the other. Unique solutions are indicated at 79.

Figure 8:
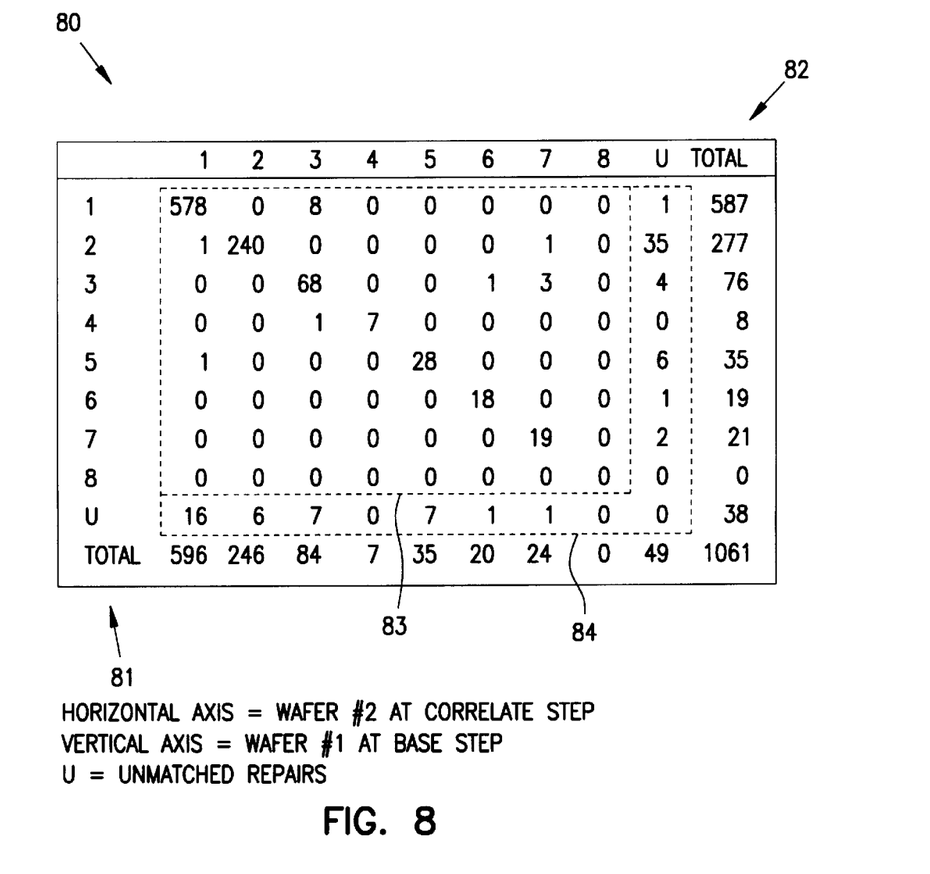
FIG. 8 shows an example of an output in accordance with the process flow chart of FIG. 9.

FIG. 8 shows an example of a diagonal table which indicates the location of repair solutions for two successive tests 80. The vertical axis represents solutions obtained in the first test 81. The horizontal axis represents solutions obtained in the second test 82. The values obtained in group 83 represent the location of solutions. The values in group 84 represent unmatched repairs. With this diagram, one skilled in the art can determine a particular fail mechanism that cannot typically be detected with merely a "pass" or "fail" output based on results after testing is completed.

A tester analyzing the outputs 40, 50, 60, 70, 80 of the present example after the above-described modification can determine several pieces of information. In the hypothetical example set forth, the tester may expect to see the number of repair solutions for a given test to increase for the second test sequence. Additionally, the tester can expect to capture the same amount of repair solutions for the first test sequence as for the second test sequence. Therefore, the tester can confirm this hypothesis with an examination that the first test sequence has a minimal number of unique repair solutions from that of the second test sequence. Additionally, for other tests, the tester may verify that the differences between the first test and the second test are minimal to ensure that the test procedures were performed similarly under similar conditions so as to add validity to the test comparisons.

Once such information is analyzed, the tester can determine how to proceed. For example, if the particular test failed by about 1% for the second test sequence with a more stringent timing adjustment or voltage adjustment, then it can be determined that the proper test modification has been found with the second test sequence. Thus, the second test sequence can be used with a certain level of confidence that the 1% final die failure will be reduced. If, however, the particular test did not fail by 1%, the tester can adjust the test parameter, e.g. timing or voltage, again until noting about a 1% additional solution repair count (for a given test) increase relative to the first test.

Additional uses of the present invention are contemplated. Among these include an example where a probe card replacement is made for a probe machine, and the functionality of the probe machine must again be confirmed. A comparison of repair solutions pre-replacement against post-replacement can be determined with a diagonal table 80 such as that indicated in FIG. 8. Test personnel can check the table for common repair solution converts between "before" and "after" probe card replacement tests of a common wafer. Additionally, the tester can consult the trend tables 40, 50, and Venn diagrams 80 for additional information. If a discrepancy is discovered, for example, the "new" probe card can be replaced or repaired.

Similarly, the above method can be used to test changes to the test sequence. For example, if a particular test is removed from the second test sequence, the data can be analyzed to determine to where the repair solution has moved to a different bin. In other words, the second test sequence can be used to determine if the remaining tests capture the errors previously captured by the eliminated test. Finally, if a bad device is discovered on the back end, the device can be run through a sequence of different front end tests and identify which test or tests capture the error and might be available for additions to the production test flow.

Figure 9A:
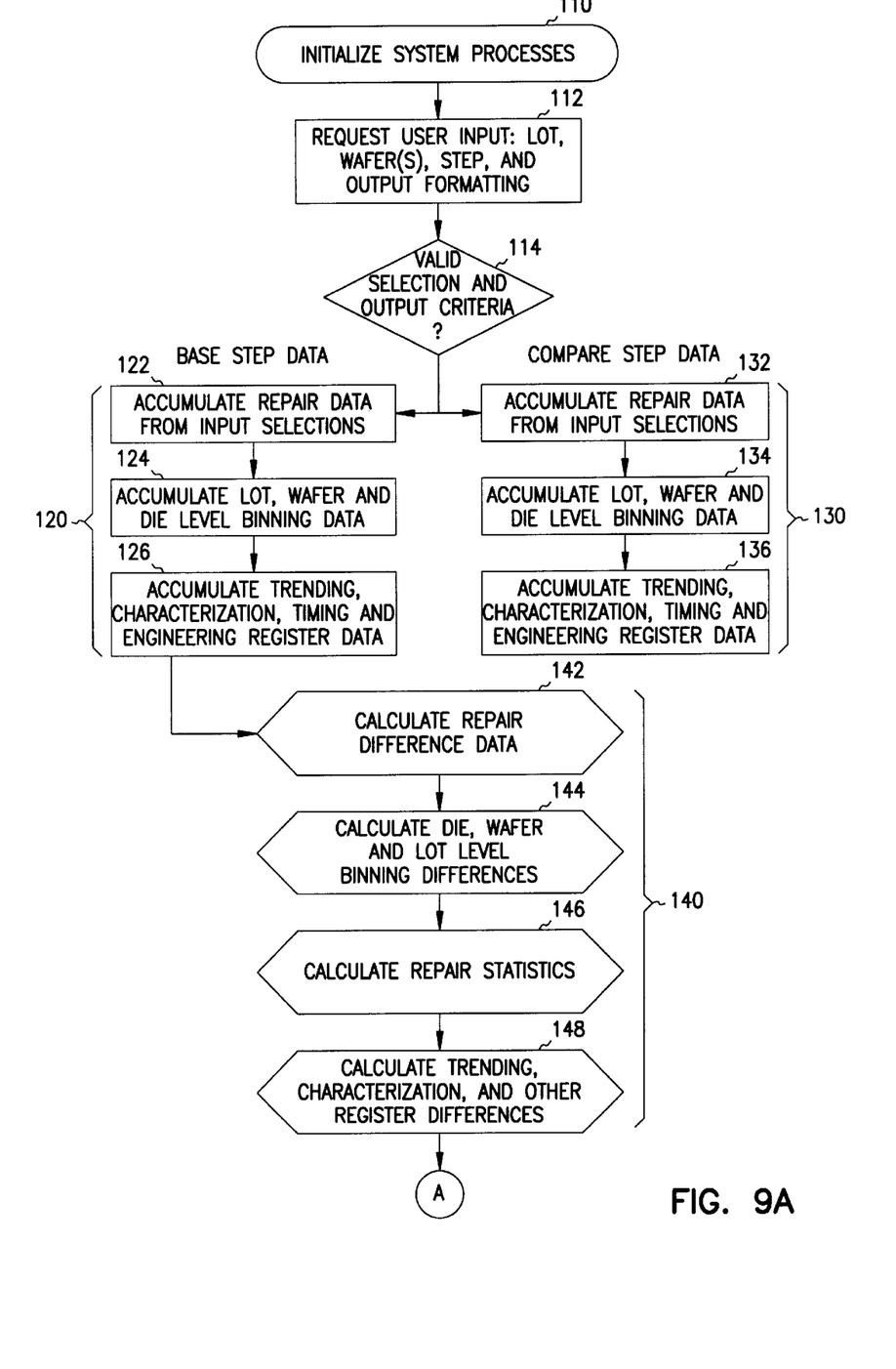
FIG. 9 shows a particular example of the process flow chart shown in FIG. 2.
Figure 9B:
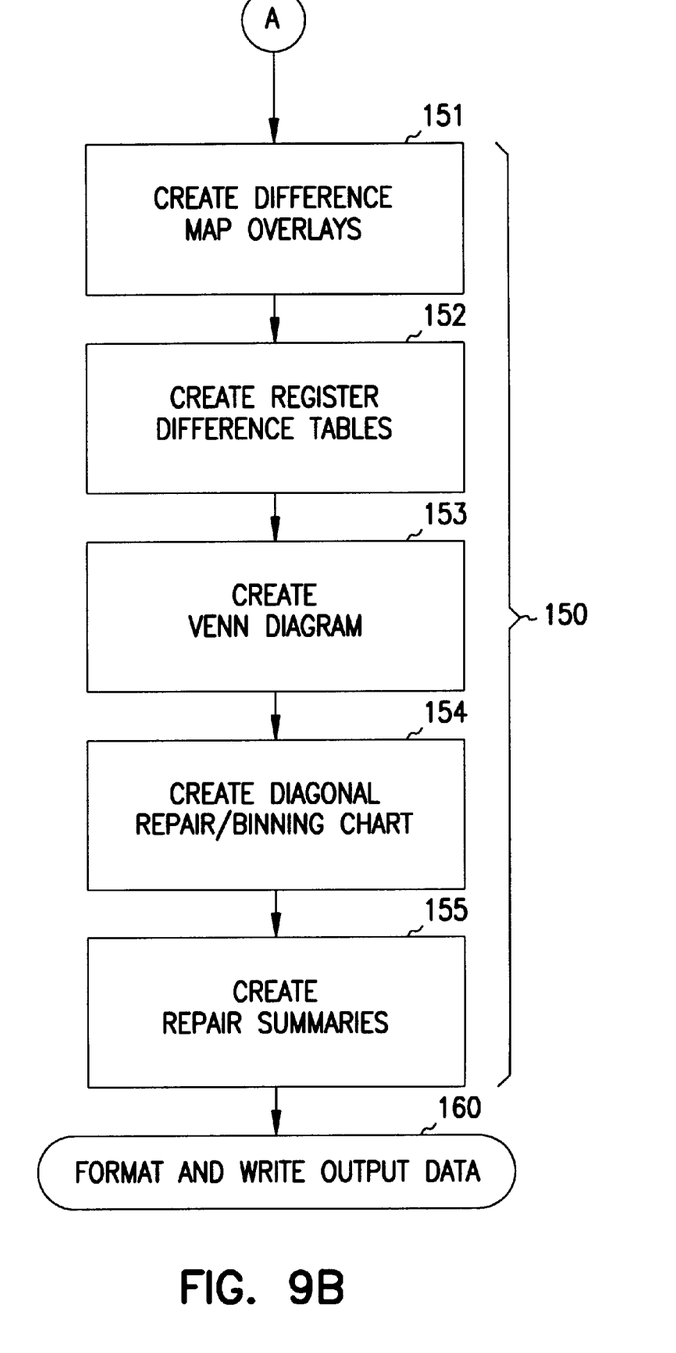

FIG. 9 shows a flow chart setting out in more detail the steps shown in FIG. 2, and is described with reference to the outputs shown in FIGS. 4–8. The first step includes an initialization of the system processes 110. The system requests a user input such as lot, wafer or wafers, step, and output formatting 112.

The system then checks to see if the user input is valid 114, and if not, returns to step 112.

The first test sequence is performed 120. Step 122 is to accumulate repair data from input selections. Step 124 is to accumulate lot, wafer and die level binning data. Step 126 is to accumulate trending, characterization, timing and engineering data. Subsequently, the second test sequence is performed 130. Step 132 is to accumulate repair data from input selections. Step 134 is to accumulate lot, wafer and die level binning data. Step 136 is to accumulate trending, characterization, timing and engineering data.

Next, a sequence of calculations and comparisons are performed on the collected results from the two test sequences 140. Repair difference data are calculated 142. Die, wafer and lot level binning differences are calculated 144. Repair statistics are calculated 146. Also, trending, characterization, and other register data are calculated 148.

Subsequently, outputs are created 150. Creating the outputs includes creating map overlays 151, creating register difference tables 152, creating Venn diagrams 153, creating diagonal repair/binning charts 154, and creating binning summaries 155. Finally, as illustrated, output data is formatted and written 160.

Although the present invention has been described with reference to preferred embodiments, workers skilled in the art will recognize that changes may be made in form and detail without departing from the spirit and scope of the invention.

What is claimed is:

1. A method for reporting test processes performed on an integrated circuit wafer, the method comprising:
   reading repair, trending, characterization, timing and engineering data for two separate test sequences performed on the integrated circuit wafer;
   comparing the data for the two separate test sequences; and
   assembling an analytical report of the test data comparisons.

2. The method of claim 1 wherein assembling an analytical report includes assembling a second analytical report and further includes displaying at least one of the analytical reports.

3. The method of claim 2 wherein the second analytical report is a set of trend, characterization, engineering and timing difference tables.

4. The method of claim 1 wherein the analytical report is a Venn diagram.

5. A method for reporting test processes, comprising:
   reading repair, trending, characterization, timing and engineering data for two separate test sequences;
   comparing the data for the two separate test sequences; and
   assembling an analytical report of the test data comparison,
wherein the analytical report is a Venn diagram with an associated correlation score percentage.

6. A method for reporting test processes, comprising:
   reading repair, trending, characterization, timing and engineering data for two separate test sequence;
   comparing the data for the two separate test sequences; and
   assembling an analytical report of the test data comparisons.
wherein the analytical report is a diagonal repair binning chart.

7. A method for reporting a test process performed on an integrated circuit wafer, the method comprising:
   accumulating base data from a base test performed on the integrated circuit wafer;
   accumulating compare data from a compare test performed on the integrated circuit wafer;
   comparing the base data with the compare data; and
   creating an analytical report based on the comparison of the base data with the compare data.

8. A method for reporting a test process, comprising:
   accumulating base step data;
   accumulating compare step data;
   comparing the base step data with the compare step data; and
   creating an analytical report based on the comparison of the base step data with the compare step data,
wherein accumulating the base step data includes:
   accumulating repair data from input selections;
   accumulating lot, wafer and die level binning data; and
   accumulating trending, characterization, timing and engineering data, from a first test sequence.

9. The method of claim 8 wherein the step of accumulating comparison step data includes:
   accumulating repair data from input selections;
   accumulating lot, wafer and die level binning data; and
   accumulating trending, characterization, timing and engineering data, from a second test sequence.

10. The method of claim 9 wherein the step of comparing the base step data with the compare step data includes at least one of:
    calculating repair difference data;
    calculating die, wafer and lot level binning differences;
    calculating repair statistics; and
    calculating trending, characterization, and other differences.

11. A method for reporting a test process, comprising:
    accumulating base step data;
    accumulating compare step data;
    comparing the base step data with the compare step data; and
    creating an analytical report based on the comparison of the base step data with the compare step data,
wherein creating the analytical report includes at least one of:
    creating a register difference table;
    creating a Venn diagram;
    creating a diagonal repair binning chart; and
    creating a repair summary.

12. The method of claim 8 further comprise:
    initializing system processes; and
    inputting user register information.

13. The method of claim 12 wherein the user register information includes at least one of lot, wafer, step, and output formatting.

14. The method of claim 12 and further including the step of verifying the user register information.

15. A computer-readable medium having computer-executable instructions to instruct a computer to performing a method comprising:

accumulating base data from a base test and compare data from a comparison test, the base test and the comparison test are performed on a single integrated circuit wafer;

comparing the base data and the compare data; and creating an analytical report based on the comparison of the base data and the compare data.

16. The computer-readable medium of claim 15 wherein accumulating includes reading repair, trending, characterization, timing and engineering data from each of the base test and the compare test.

17. A computer-readable medium having computer-executable instructions to instruct a computer to performing a method comprising:

accumulating base data from a base test and compare data from a comparison test;

comparing the base data and the compare data; and creating an analytical report based on the comparison wherein comparing the base data and the compare data includes at least one of:

calculating repair difference data;

calculating die, wafer and lot level binning differences;

calculating repair statistics; and calculating trending, characterization, and other differences.

18. A computer-readable medium having computer-executable instructions of instruct a computer to performing a method comprising:

accumulating base data from a base test and compare data from a comparison test;

comparing the base data and the compare data; and creating an analytical report based on the comparison wherein creating the analytical report includes at least one of:

creating a register difference table;

creating a Venn diagram;

creating a diagonal repair binning chart; and creating a repair summary.

* * * * *

UNITED STATES PATENT AND TRADEMARK OFFICE
CERTIFICATE OF CORRECTION

PATENT NO.: 6,070,131
DATED: May 30, 2000
INVENTOR(S): Damon et al.

It is certified that errors appear in the above-identified patent and that said Patent is hereby corrected as shown below:

In column 5, delete the paragraph break before line 5, so that lines 5 and 6 are included in the preceding paragraph.

In column 8, line ,6 delete "of" and insert --to--, therefor.

Signed and Sealed this

Twenty-second Day of May, 2001

Attest:

NICHOLAS P. GODICI

Attesting Officer

Acting Director of the United States Patent and Trademark Office